United States Patent [19]

Takayama

[11] Patent Number: 4,852,034

[45] Date of Patent: Jul. 25, 1989

[54] DIGITAL FILTER

[75] Inventor: Morihiko Takayama, Tokyo, Japan

[73] Assignee: System Instruments Co., Ltd., Hachioji, Japan

[21] Appl. No.: 106,418

[22] Filed: Oct. 6, 1987

[30] Foreign Application Priority Data

Oct. 8, 1986 [JP] Japan .................................. 61-237880

[51] Int. Cl.⁴ .............................................. G06F 7/38
[52] U.S. Cl. ................................ 364/724.01; 364/825
[58] Field of Search .................... 73/61.1 C; 307/520, 307/521, 522; 328/167; 364/724.1, 825

[56] References Cited

U.S. PATENT DOCUMENTS 4,016,410 4/1977 Eggernort ........................... 364/724
4,584,600 4/1986 Baker ............................... 364/724 X
4,694,414 9/1987 Christopher ....................... 364/724

Primary Examiner—Steven Mottola
Attorney, Agent, or Firm—Blakely, Sokoloff, Taylor & Zafman

[57] ABSTRACT

A digital filter includes at least one cascade-connected unit digital filter. The unit digital filter is constituted by a comb filter and an integrator cascade-connected thereto.

6 Claims, 2 Drawing Sheets

DIGITAL FILTER

BACKGROUND OF THE INVENTION

The present invention relates to a digital filter and, more particularly, to a digital filter for reducing noise in an input signal in a device for measuring a signal of a very low level.

When quantitative analysis of a sample is performed, a chromatograph has been widely used because material composition analysis and its quantitative analysis can be economically performed with a relatively simple operation. The limitations of chromatographic capacity for analyzing a sample of a very low level are determined by a noise component included in an input signal. This noise may be reduced by a filter. However, a frequency band used in the chromatograph falls within the range of 10 Hz to $10^{-3}$ Hz. a conventional filter used at such low frequencies cannot satisfy characteristics required by the specifications of the chromatograph.

SUMMARY OF THE INVENTION

It is an object of the present invention to provide a digital filter which can eliminate the above-described drawback of the conventional technique and satisfy characteristics required by the specifications of a measuring device, such as a chromatograph, for measuring a signal of a very low level.

A digital filter according to the present invention is constituted by at least one cascade-connected unit filter constituted by a comb filter and an integrator cascade-connected thereto.

DETAILED DESCRIPTION OF THE PREFERRED EMBODIMENTS

Figure 1:
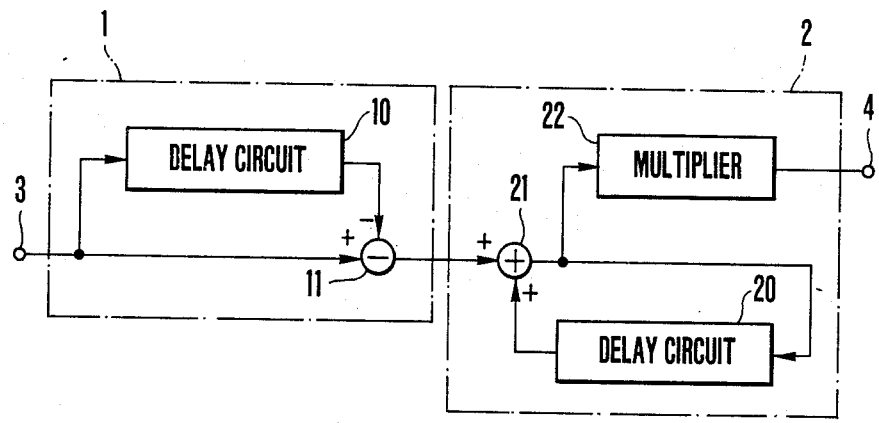
FIG. 1 is a block diagram showing an arrangement of an embodiment of the present invention.

FIG. 1 is a block diagram showing an embodiment of a digital filter according to the present invention. As will be described later, although the embodiment is constituted by N series-connected circuits shown in FIG. 1, only one unit thereof is shown for the sake of simple explanation, where N is positive integer.

Referring to FIG. 1, an input signal having a frequency f (Hz) which is sampled by a sampling frequency fs (Hz) is input from an input terminal 3 as a digital signal. This digital input signal is input to the input terminal of a delay circuit 10 for delaying the signal by Q sampling periods, and to one input terminal of a subtractor 11. The subtractor 11 calculates the difference between the digital signal input to the input terminal 3 and the output signal of the delay circuit 10, that is, the digital signal input which is Q sampling periods ahead of the current sampling period and then outputs the difference signal. Accordingly, a circuit 1 surrounded by an alternate long and short dashed line has a function as a comb filter.

An output signal from the subtractor 11 is added by an adder 21 to an output signal of a delay circuit 20 which delays its own input signal by Q sampling periods. The sum signal is inputted to the delay circuit 20 and a 1/Q multiplier 22. An output from the multiplier 22 becomes an output from the digital filter shown in FIG. 1. A circuit 2 surrounded by an alternate long and short dashed line has a function as an integrator. The comb filter 1 serves as a circuit for subtracting Qth previous sampled value from the currently sampled value, and the system function Hc(Z) thereof is given as:

$$Hc(Z) = 1 - Z^{-Q} \quad (1)$$

where Z is a Z function.
The frequency characteristic is given as:

$$Hc(e^{j\omega}) = 1 - e^{-j\omega Q} = 2j \cdot e^{-jQ\omega/2} \cdot \sin(\omega Q/2) \quad (2)$$

for $$\omega = 2\pi fn = 2\pi f/fs = 2\pi f \cdot T \quad (3)$$

where fn is a frequency given by normalizing the input signal frequency f (Hz) by the sampling frequency fs (Hz), i.e., fn=f/fs and T is a sampling period or a sampling rate.

Figure 2:
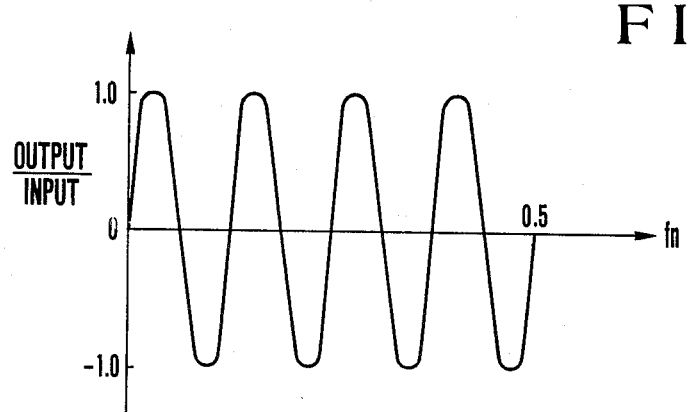
FIG. 2 is a graph showing a frequency characteristic of a comb filter in FIG. 1.

FIG. 2 shows a frequency characteristic of fn when Q=16, wherein eight zero points are present within the range of $0 \leq fn < 0.5$. In general, when the number of delays is Q, the number of zero points is Q/2.

A system function $H_I(Z)$ and the frequency characteristic of the integrator 2 can be represented by equations (4) and (5) as follows:

$$H_I(Z) = 1/(1 - Z^{-1}) \quad (4)$$

$$H_I(e^{j\omega}) = 1/(1 - e^{-j\omega}) = e^{j\omega/2} \cdot 1/\{2j \sin(\omega/2)\} \quad (5)$$

Figure 3:
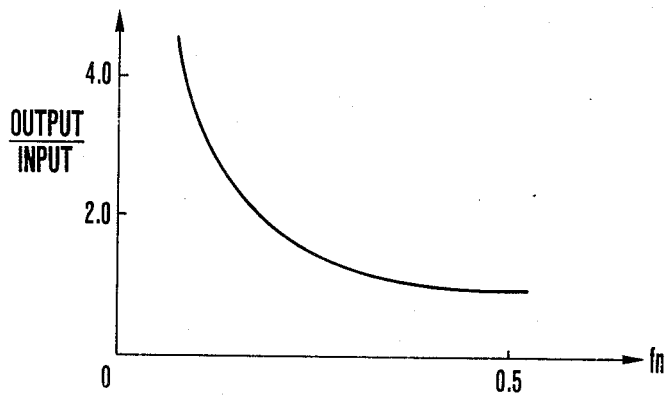
FIG. 3 is a graph showing a frequency characteristic of an integrator in FIG. 1.

FIG. 3 shows an example of the frequency characteristic represented by equation (5).

The total frequency characteristic of the digital filter of the present invention shown in FIG. 1 is a product of the frequency characteristics of the comb filter 1 and the integrator 2 and can be given as follows:

$$H(e^{j\omega}) = e^{-j(Q-1)\omega/2} \cdot \sin(\omega Q/2)/\sin(\omega/2) \quad (6)$$

Since the output as a limit value where ω is zero becomes Q times the input, the multiplier 22 is provided to perform a multiplication of 1/Q so as to compensate for the output. If Q is set to a power of 2, an operation of the multiplication of 1/Q is equivalent to that of bit shifting, thereby simplifying the arrangement of the multiplier 22. The operation result by the multiplier 22, i.e., the output signal from an output terminal 4 is given as follows:

$$H(e^{j\omega}) = e^{-j(Q-1)\omega/2} \cdot (1/Q) \cdot \{\sin(\omega Q/2)/\sin(\omega/2)\} \quad (7)$$

A phase characteristic ψ(ω) of the output signal is given as follows:

$$\psi(\omega) = \arg[H(e^{j\omega})] = -(Q-1)\omega/2 \quad (8)$$

Accordingly, equation (8) shows a linear phase characteristic of a group-delayed $(Q-1)/2$ sample, and hence no signal distortion is generated.

A system function $H_L(Z)$ of the digital filter constituted by the N cascade-connected digital filters, each of which is shown in FIG. 1, is given as follows:

$$H_L(Z) = \{(1/Q) \cdot (1-Z^{-Q})/(1-Z^{-1})\}^N \quad (9)$$

The frequency characteristic of this system is given as follows:

$$H_L(e^{j\omega}) = e^{-j(Q-1)N\omega/2} \cdot \{(1/Q) \cdot \sin(Q\omega/2)/\sin(\omega/2)\}^N \quad (10)$$

Figure 4:
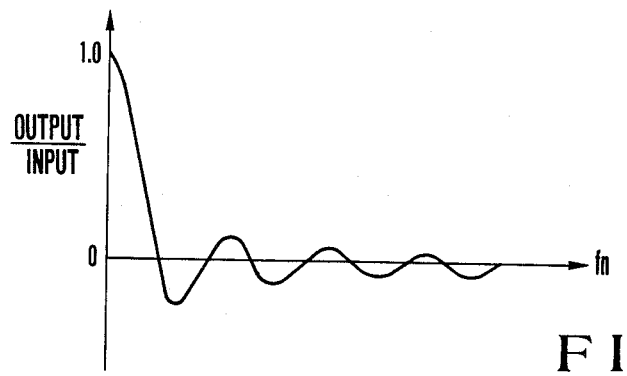
FIG. 4 is a graph showing input/output characteristics of a digital filter in FIG. 1.

FIG. 4 shows a curve representing equation (10). The negative characteristics shown in FIG. 4 can be prevented by setting N to be an even number. When $Q=16$ in FIG. 4, the first zero-crossing position is located at $f_n=1/16$. Accordingly, the zero-crossing position can be controlled by changing fs, i.e., T.

Figure 5:
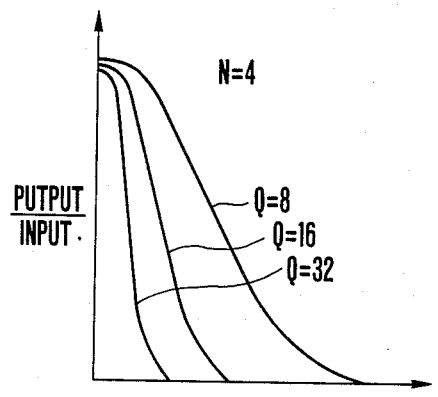
FIGS. 5 and 6 are graphs showing frequency characteristics of various arrangements.
Figure 6:
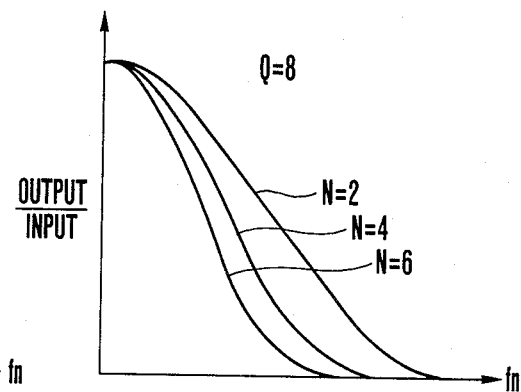

FIG. 5 shows the frequency characteristics when N is a constant and Q is a variable, by setting $N=4$. FIG. 6 shows the frequency characteristics when Q is a constant and N is a variable, by setting $Q=8$. As is apparent from the above description, a filter having arbitrary characteristics can be realized by changing Q, N, and T. For example, if $Q=16$ and $N=8$, the system function becomes about $1/4.3 \times 10^9$, thereby realizing a filter having a steeper response curve than that of the conventional filter.

Figure 7:
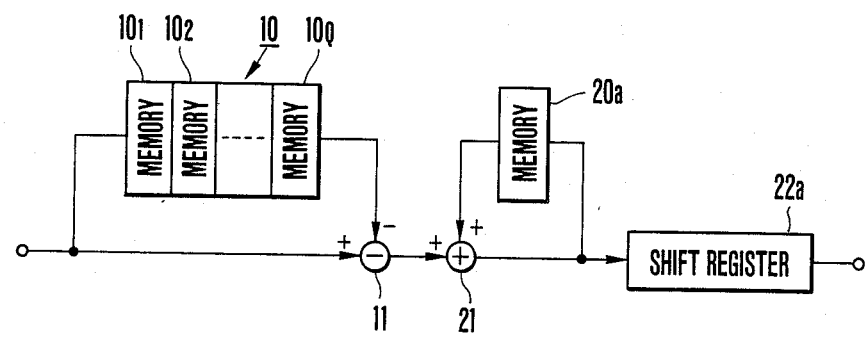
FIG. 7 is a block diagram showing another embodiment of the present invention.

FIG. 7 is a block diagram showing another embodiment of the digital filter according to the present invention. An overall arrangement in FIG. 7 is equivalent to that of the embodiment shown in FIG. 1. A delay circuit 10 is constituted by Q memories $10_1$ to $10_Q$. A delay circuit 20 is constituted by a memory 20a. An integrator 22 is constituted by a shift register 22a. Data transmission to the memories $10_1 \ldots 10_Q$ and $20a$, and the shift register $22a$ is performed by a CPU (not shown). In this case, frequencies of input signals processed by the chromatograph are sufficiently low, as described above. In contrast to this, an operating frequency of the CPU is sufficiently high, and hence required filter characteristics can be easily realized. Note that FIG. 7 is a block diagram showing one unit and N such units are cascade-connected in a practical application.

As has been described above, the digital filter according to the present invention is constituted by a required number of cascade-connected unit digital filters, each of which is constituted by the comb filter and the integrator cascade-connected thereto so that characteristics which cannot be obtained by the conventional filter can be easily obtained without adjustment, and hence the present invention is effective in improving the noise reduction function. Therefore, if this filter is incorporated in a detector using a chromatograph, a signal of a very low level, which exceeds the limit of the conventional filter, can be detected.

What is claimed is:

1. A digital filter comprising at least one cascade-connected unit digital filter having a comb filter and an integrator cascade-connected thereto, wherein said comb filter comprises first delaying means for delaying a signal input to said unit digital filter by Q sampling periods and means for calculating a first delay between the input signal and an output signal from said first delaying means, and said integrator comprises second delaying means for delaying a signal input to said integrator, adding means for adding to an output from said comb filter an output from means for calculating a second delay between the signal input to said integrator and an output from said second delaying means and outputting a sum signal to said second delaying means, and multiplying means for multiplying the output from said adding means by 1/Q and outputting a multiplied signal as an output signal of said unit digital filter.

2. A filter according to claim 1, wherein said first delaying means comprises Q memories for performing digital processing.

3. A filter according to claim 1, wherein said second delaying means comprises a single memory for performing digital processing.

4. A filter according to claim 1, wherein Q is set to a power of 2, and said multiplying means comprises a shift register.

5. A filter according to claim 2, wherein said at least one cascade-connected unit digital filters is an even number of cascade-connected unit digital filters.

6. A digital filter comprising at least one cascade unit digital filter having a comb filter and an integrator cascade-connector thereto, wherein said comb filter comprises first delaying means for delaying a signal input to said unit digital filter by Q sampling periods and means for calculating a difference between the input signal and an output signal from said first delay means, and said integrator comprises second delaying means for delaying a signal input to said integrator, adding means for adding an output from said difference calculating means to an output from said second delaying means and outputting a sum signal to said second delaying means, and multiplying means for multiplying the output from said adding means by 1/Q and outputting a multiplied signal as an output signal of said unit digital filter.

* * * * *